(12) United States Patent
Sakata (10) Patent No.: US 8,932,896 B2
(45) Date of Patent: Jan. 13, 2015

(54) SOLAR CELL MANUFACTURING APPARATUS AND SOLAR CELL MANUFACTURING METHOD

(75) Inventor: Genji Sakata, Kanagawa (JP)

(73) Assignee: Ulvac, Inc., Kanagawa (JP)

( * ) Notice: Subject to any disclaimer, the term of this patent is extended or adjusted under 35 U.S.C. 154(b) by 183 days.

(21) Appl. No.: 13/696,880

(22) PCT Filed: Jun. 8, 2011

(86) PCT No.: PCT/JP2011/003243
§ 371 (c)(1),
(2), (4) Date: Nov. 8, 2012

(87) PCT Pub. No.: WO2011/155199
PCT Pub. Date: Dec. 15, 2011

(65) Prior Publication Data
US 2013/0052771 A1    Feb. 28, 2013

(30) Foreign Application Priority Data

Jun. 10, 2010   (JP) .................................. 2010-133319

(51) Int. Cl.
H01L 31/18      (2006.01)
H01L 31/0236    (2006.01)
(Continued)

(52) U.S. Cl.
CPC .......... *H01L 21/266* (2013.01); *H01L 21/2236* (2013.01); *H01L 31/1804* (2013.01); *Y02E 10/547* (2013.01)
USPC ..... 438/71; 118/720; 118/723 R; 257/E31.13

(58) Field of Classification Search
USPC ................................ 438/71; 118/720, 723 R
See application file for complete search history.

(56) References Cited

U.S. PATENT DOCUMENTS

| | | | |
|---|---|---|---|
| 4,353,160 A | 10/1982 | Armini et al. | |
| 5,356,488 A | 10/1994 | Hezel | |
| 5,449,626 A | 9/1995 | Hezel | |

(Continued)

FOREIGN PATENT DOCUMENTS

| | | | |
|---|---|---|---|
| JP | 61-188845 A | 8/1986 | |
| JP | 06-061515 A | 3/1994 | |

(Continued)

OTHER PUBLICATIONS

Office Action from Japanese Patent App. No. 2012-519257 (Jan. 21, 2014).

(Continued)

*Primary Examiner* — Alexander Ghyka
(74) *Attorney, Agent, or Firm* — Cermak Nakajima & McGowan LLP; Tomoko Nakajima (57) ABSTRACT

The solar cell manufacturing apparatus includes: a load lock chamber configured to allow loading and unloading of a substrate by switching between atmospheric ambient and vacuum ambient; a processing chamber where the substrate for a solar cell is to be doped with impurity ions for pn junction formation in the vacuum ambient; and a conveyance chamber including a conveyance unit configured to convey the substrate between the load lock chamber and the processing chamber. The doping of impurity ions is performed by irradiation with the impurity ions from an ion gun, and the ion gun is provided with a grid plate, as its ion irradiation surface, facing the substrate conveyed to the processing chamber.

3 Claims, 4 Drawing Sheets

(51) Int. Cl.
*H01L 21/266* (2006.01)
*H01L 21/223* (2006.01)

(56) References Cited

U.S. PATENT DOCUMENTS

| | | |
|---|---|---|
| 2007/0017445 A1 | 1/2007 | Takehara et al. |
| 2007/0020903 A1 | 1/2007 | Takehara et al. |
| 2008/0132046 A1 | 6/2008 | Walther |
| 2008/0194086 A1 | 8/2008 | Sasaki et al. |
| 2011/0186118 A1* | 8/2011 | Kim .............................. 136/256 |
| 2012/0214273 A1* | 8/2012 | Riordon et al. ................. 438/87 |
| 2012/0301999 A1* | 11/2012 | Tucci et al. ..................... 438/72 |
| 2013/0108799 A1* | 5/2013 | Weaver et al. ................. 427/526 |
| 2013/0143353 A1* | 6/2013 | Ramappa ........................ 438/98 |

FOREIGN PATENT DOCUMENTS

| | | |
|---|---|---|
| JP | 07-131043 A | 5/1995 |
| JP | 8-213339 A | 8/1996 |
| JP | 2000-011905 A | 1/2000 |
| JP | 2001-267314 A | 9/2001 |
| JP | 2007-023380 A | 2/2007 |
| JP | 2009-283277 A | 12/2009 |
| WO | WO2005/119745 A1 | 12/2005 |

OTHER PUBLICATIONS

International Search Report for PCT Patent App. No. PCT/JP2011/003243 (Jul. 12, 2011).
Office Action for Japanese Patent App. No. 2012-519257 (Oct. 22, 2013).
Han, S., et al., "Plasma Source Ion Implantation—A Three Dimensional Ion Implantation Technique," 1995, p. 101.
Office Action from Korean Patent App. No. 10-2013-7000150 (Mar. 20, 2014).

* cited by examiner

SOLAR CELL MANUFACTURING APPARATUS AND SOLAR CELL MANUFACTURING METHOD

This application is a national phase entry under 35 U.S.C. §371 of PCT Patent Application No. PCT/JP2011/003243, filed on Jun. 8, 2011, which claims priority under 35 U.S.C. §119 to Japanese Patent Application No. 2010-133319, filed Jun. 10, 2010, both of which are incorporated by reference.

TECHNICAL FIELD

The present invention relates to a solar cell manufacturing apparatus and a solar cell manufacturing method.

BACKGROUND ART

In some conventional solar cells, impurities such as phosphor or arsenic are doped into mono or polycrystalline silicon substrates to form pn junctions. In such a solar cell, it is generally known that electrons and holes formed at the pn junction are recombined to reduce the conversion efficiency (power generation efficiency). This has led to the proposition of a selective emitter structure in which an emitter layer is doped with impurities with parts of the emitter layer to be in contact with the surface electrodes set to be doped with impurities at a higher concentration than the other parts of the emitter layer, and thereby the other parts not to be in contact with the surface electrodes locally have higher resistance.

In such a selective emitter structure, impurities are conventionally doped by a so-called coating diffusion process (a spray process) (see Patent Document 1, for example). At the coating diffusion process, a coating liquid in which n-type impurities are dissolved in an organic solvent is prepared first and is applied to the surface of a p-type substrate by using a spin coater or the like. The substrate is then subjected to annealing for thermal diffusion of the n-type impurities of the coating liquid. By the annealing, an n+ layer of high concentration is formed in the surface of the substrate, and an n layer of low concentration is formed at the position deeper than the n+ layer. Next, the region of the surface of the substrate where the surface electrodes are to be formed is covered with a mask, and part of the n+ layer not covered with the mask is removed by etching to expose the n layer. The mask is then removed.

Herein, in the coating diffusion process, the concentration distribution of impurities doped into the substrate and the depth of the impurities from the surface of the substrate are controlled by using the concentration of the coating liquid and annealing time. However, the thermal diffusion of impurities requires long processing time (generally, 30 minutes at an annealing temperature of 925° C.). Moreover, it is difficult to accurately control the depth of impurities from the substrate surface throughout the substrates to be processed.

Furthermore, it is necessary to improve the wettability of a coating liquid at applying the coating liquid to the substrate through spin coating or the like. This requires a process to previously remove naturally oxidized film in the substrate surface prior to the application of the coating liquid, thus resulting in an increase in the number of processes. Moreover, some of the coating liquid overflows to the side surface of the substrate at application of the coating liquid. This requires a process to perform edge cutting to cut off the edge of the substrate. Accordingly, use of the coating diffusion process to dope impurities has the problems of low mass-productivity at manufacturing solar cells due to a large number of processes and long processing time.

On the other hand, there is another proposition that impurities are doped in the selective emitter structure by using an ion injection apparatus for use in manufacturing semiconductor devices (see Patent Document 2, for example). However, the ion injection apparatus is typically configured to generate many kinds of ions by ion sources, separate necessary ions from the many kinds of ions by a mass separator, and then irradiate a substrate with the ion beam accelerated by an accelerator and thereby controlled to a predetermined injection energy. Accordingly, the ion injection apparatus includes a large number of parts and is expensive. Moreover, the ion injection apparatus scans the substrate surface with an ion beam in directions X and Y for injection of predetermined ions, which requires long processing time. The injection apparatus has therefore limitations on the improvement of the mass-productivity by increasing the throughput.

PRIOR ART DOCUMENTS

Patent Documents

Patent Document 1: Japanese Patent Application Publication No. H7-131043
Patent Document 2: The specification of U.S. Pat. No. 4,353,160

SUMMARY OF INVENTION

Problems to be Solved by the Invention

In the light of the aforementioned problems, an objective of the present invention is to provide a solar cell manufacturing apparatus and a solar cell manufacturing method which are excellent in mass productivity with low cost.

Means for Solving the Problems

In order to solve the aforementioned problem, a solar cell manufacturing apparatus of the present invention includes: a load lock chamber configured to allow loading and unloading of a substrate by switching between atmospheric ambient and vacuum ambient; a processing chamber where the substrate for a solar cell is to be doped with impurity ions for pn junction formation in the vacuum ambient; and a conveyance chamber including a conveyance unit configured to convey the substrate between the load lock chamber and the processing chamber. The doping of impurity ions is performed by irradiation with the impurity ions from an ion gun and the ion gun is provided with its ion irradiation surface facing the substrate conveyed to the processing chamber.

According to the present invention, the substrate is conveyed to the position facing the ion irradiation surface of the ion gun, and the impurity ions are irradiated onto the substrate by the ion gun and thus are doped into the substrate. At this time, by employing the configuration in which the impurity ions are irradiated in the direction substantially orthogonal to the substrate, the impurity ions can be doped from the surface of the substrate into any deep position because of the channeling phenomenon. Accordingly, the present invention requires fewer manufacturing steps than the coating diffusion method and does not need an annealing process to thermally diffuse impurities doped in the substrate. The mass-productivity is therefore increased. Moreover, the present invention does not require a mass separator, an accelerator, and the like to dope impurity ions, thus reducing the cost.

Assuming that a direction toward the substrate from the ion irradiation surface is a downward direction, the ion gun in the present invention preferably includes a plasma generation chamber capable of generating plasma containing impurity ions and a grid plate which is provided at a lower end portion of the plasma generation chamber and constitutes the ion irradiation surface. The grid plate includes a plurality of through-holes, and a region where the through-holes are formed is larger than the area of the substrate. The ion gun is preferably configured to hold the grid plate at a predetermined voltage to extract the impurity ions in the plasma generated within the plasma generation chamber downward through the through-holes.

According to the present invention, the depth and concentration of impurities in the substrate can be highly accurately controlled by only controlling the voltage applied to the grid plate. Moreover, since the region of the grid plate where the through-holes are formed is larger than the area of the substrate, the entire surface of the substrate is uniformly irradiated with the impurity ions. Accordingly, the processing time can be made shorter than that taken to scan the surface of the substrate with an ion beam, and the cost can be further reduced.

In the present invention, the solar cell manufacturing apparatus further preferably includes: a mask located between the ion irradiation surface and the substrate and configured to locally shield the substrate; and a carrier unit configured to carry the mask in such a way as to freely advance and retract the mask to and from a shield position between the ion irradiation surface and the substrate. This allows the substrate to be locally doped with the impurity ions by only properly advancing or retracting the mask. The present invention is advantageous especially in doping of impurities in the selective emitter structure. In this process, processes to form a mask on the substrate surface and remove the mask are not necessary. The mass-productivity can be further increased.

The conveyance unit is a substrate rotation table which is rotatable in a single plane parallel to the ion irradiation surface and is capable of holding a plurality of substrates at predetermined circumferential intervals. The carrier unit is a mask rotation table which is rotatable around the rotation center of the substrate rotation table above the substrate rotation table and is capable of holding a plurality of masks at predetermined circumferential intervals. It is therefore possible to build a configuration to advance or retract the masks relative to the substrates.

Furthermore, to solve the aforementioned problems, a solar cell manufacturing method of the present invention includes: an ion irradiation step of irradiating a substrate for a solar cell with ions of impurity selected from P, As, Sb, Bi, B, Al, Ga, and In from an ion irradiation surface of an ion gun facing the substrate; a defect repair step of performing annealing to repair defects caused in the substrate in the ion irradiation step; and an impurity diffusion step of diffusing the impurity by the annealing. Herein, in the present invention, the substrate includes one having a texture structure in the surface irradiated with the impurity ions.

According to the present invention, the impurity ions are doped from the surface of the substrate into any deep position because of the channeling phenomenon. The impurity ions can be therefore injected with lower energy. Accordingly, the annealing to repair defects (i.e., recrystallization) does not require long time. Moreover, the annealing to diffuse the impurity in a manner similar to the above-described conventional example does not require long time. The mass productivity of solar cells can be therefore increased.

MODES FOR CARRYING OUT THE INVENTION

Hereinafter, with reference to the drawings, a solar cell manufacturing apparatus and a solar cell manufacturing method according to an embodiment of the present invention are described by way of example for the case where a solar cell of a selective emitter structure is manufactured by doping phosphor or boron into a substrate S which is composed of a mono or polycrystalline silicon substrate. In the following description, the direction from an ion irradiation surface of a later-described ion gun toward the substrate is referred to as a downward direction (to the downward direction in FIG. 2).

Figure 1:
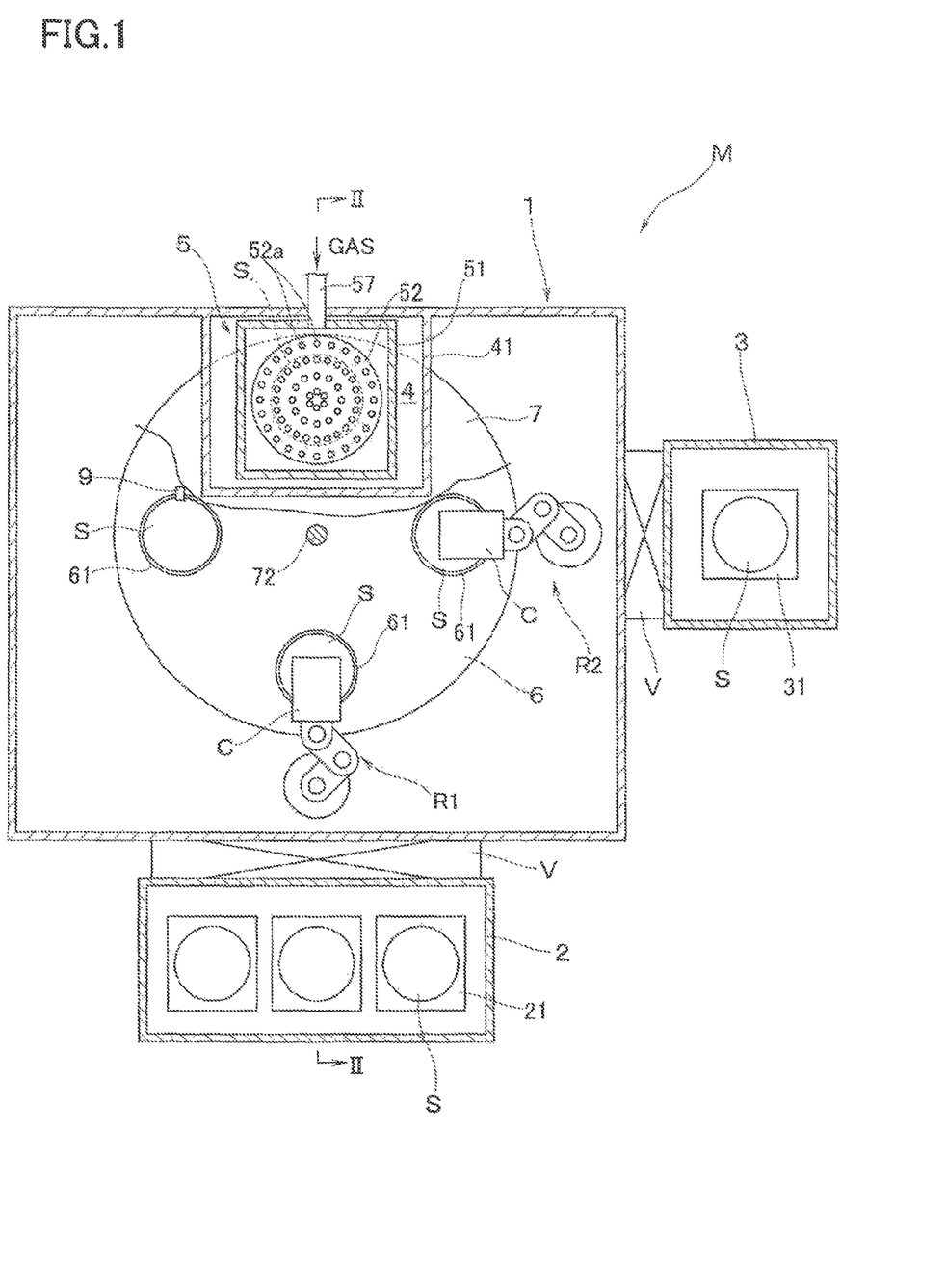
FIG. 1 is a cross-sectional view schematically illustrating the configuration of a solar cell manufacturing apparatus of an embodiment of the present invention.
Figure 2:
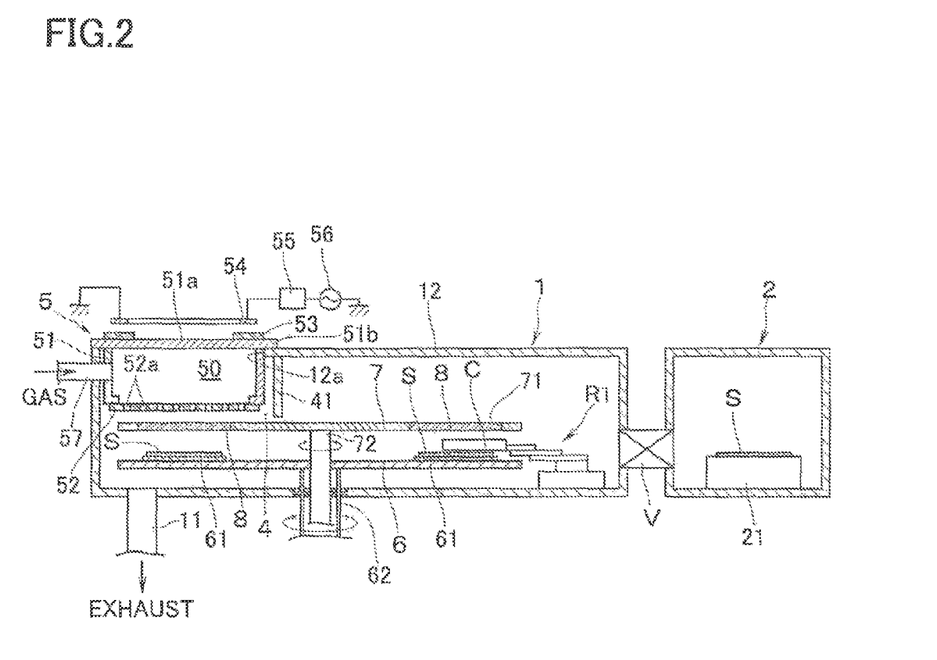
FIG. 2 is a cross-sectional view taken along a line II-II of FIG. 1.

With reference to FIGS. 1 and 2, M indicates a solar cell manufacturing apparatus of the embodiment of the present invention. The solar cell manufacturing apparatus M includes: a central conveyance chamber 1 having a substantially rectangular-cuboidal shape; a load lock chamber 2 and an annealing chamber 3 provided around the conveyance chamber 1 with gate valves V interposed therebetween. The conveyance chamber 1 is connected to an exhaust pipe 11 communicating with a not-shown vacuum pump and can be evacuated and held at a predetermined vacuum pressure. At the position opposite to the load lock chamber 2 in the conveyance chamber 1, a partition plate 41 defining a processing chamber 4 is provided. The lower end of the partition plate 41 extends to the vicinity of the surface of a later-described mask rotation table. An ion gun 5 is provided in the upper side of the conveyance chamber 1 so as to face the processing chamber 4.

The ion gun 5 includes: an ion gun body 51 having a tubular shape with a closed bottom; and a grid plate 52 which is attached to a lower end opening of the ion gun body 51 and forms an ion irradiation surface. The internal space surrounded by the ion gun body 50 and grid plate 52 constitutes a plasma generation chamber 50. The ion gun body 51 is hung in such a way that the ion gun body 51 is inserted from above into an opening 12a formed in a region of a conveyance chamber upper face 12 which is partitioned by the partition plate 41 and a flange 51b formed in a bottom plate 51a is locked with the edge of the opening 12a. On the bottom plate 51a of the ion gun body 51, a permanent magnet 53 is provided. The permanent magnet 53 forms lines of magnetic flux within the plasma generation chamber 50. Above the permanent magnet 53, a high-frequency antenna 54 is provided. The high-frequency antenna 54 is connected to a high-frequency power source 56 through a matching box 55.

The ion gun body 51 is connected to a gas introducing pipe 57 through which a phosphor containing gas is introduced, and the other end of the gas introducing pipe 57 communicates with a gas source storing the phosphor containing gas via a mass flow controller. The phosphor containing gas is $PH_3$, $PF_3$, $PF_5$, $PCl_3$, $PCl_5$, $POCl_3$, or the like. Impurities to be doped into the substrate are properly selected according to the substrate, and besides the phosphor containing gas, the gas used in the ion gun 5 is an As containing gas ($AsH_3$, $AsF_3$, $AsF_5$, $AsCl_3$, $AsCl_5$, or the like), a Sb or Bi containing gas which belongs to group V of the periodic system, a B containing gas ($B_2H_6$, $BF_3$, $BCl_3$, $BBr_3$, or the like), or an Al, Ga or In containing gas, which belongs to group III of the periodic system, or the like. The method of supplying gas is not limited to the above method. The gas may be supplied by vaporizing a liquid or solid material containing impurities such as phosphor and supplying the same to the plasma generation chamber 50 through the gas introducing pipe 57.

On the other hand, the grid plate 52 is composed of a plate made of a conductive material such as C (carbon), Al (aluminum), Si (silicon), CN (carbon nitride), and SUS. On the surface of the grid plate 52, a plurality of through-holes 52a are formed. In this case, the diameter and number of through holes 52a and the intervals between the through holes 52a are appropriately selected according to the impurities to be doped. The size of the region where the through-holes 52a are formed is set larger than the area of the substrate S. The grid plate 52 is connected to a power supply for ion extraction (not shown), and a predetermined potential is applied to the grid plate 52. The predetermined gas is introduced through the gas introducing pipe 57 into the plasma generation chamber 50, and a predetermined high-frequency power is applied to the high-frequency antenna 54, thus generating plasma within the plasma generation chamber 50 through ISM (inductive super magnetron) process. A predetermined potential is then applied to the grid plate 52, and phosphor ions in the plasma are therefore extracted downward through the through holes 52a of the grid plate 52.

Within the conveyance chamber 1, a substrate rotation table (a conveyance unit) 6 is provided. The substrate rotation table 6 is rotatable in a single plane parallel to the grid plate 52. On the substrate rotation table 6, substrate holders 61 are provided at circumferential intervals of 90 degrees. Each of the substrate holders 61 is composed of an electrostatic chuck provided with positive and negative electrodes and is configured to attract and hold a substrate with electrostatic force. To the center of the lower surface of the substrate rotation table 6, a hollow rotating shaft 62 extended from a not-shown driving source, such as a servomotor, is joined. When the rotation table 6 is driven to intermittently rotate 90 degrees by 90 degrees with the driving source, the substrates held by the substrate holders 61 are conveyed to a load/unload position facing the load lock chamber 2, a later-described alignment position, an ion irradiation position at which each substrate is irradiated by ions from the ion gun 5, and an annealing chamber conveyance position facing the annealing chamber.

Above the substrate rotation table 6, a mask rotation table 7 (a carrier unit) is provided. The rotation table 7 is provided with circular openings 71 formed at circumferential intervals of 90 degrees. Each circular opening 71 has a size larger than the area of each substrate S. The circular openings 71 are configured so that a mask 8 having a profile corresponding to that of the circular openings 71 can be dropped and set in each opening 71. To the center of the lower surface of the mask rotation table 7, a rotating shaft 72 extending from a not-shown driving source, such as a servomotor, is joined coaxially with the rotating shaft 62. When the mask rotation table 7 is driven to intermittently rotate around the rotation center of the substrate rotation table 6 by driving source, in a manner similar to the substrate rotation table 6, the masks 8 set in the circular openings 71 are moved to the load/unload position, the alignment position, the ion irradiation position, and the annealing chamber conveyance position.

Herein, in each mask 8, a shielding film 82 made of alumina or the like is formed to a predetermined thickness on a silicon plate 81 by spattering or the like, and the linear openings 83 are provided for the shielding film 82 at predetermined intervals according to the selective emitter structure by etching or the like. Moreover, through holes 84 communicating with the openings 83 are provided for the plate 81. The masks 8 are set in only two openings opposite to each other among the four openings 71 of the rotation table 7, thus allowing for choice of ion irradiation with or without a mask for a substrate located at the ion irradiation position. The masks 8 can therefore freely advance and retract to a shield position at which each mask 8 locally shields the substrate S between the grid plate 52 and substrate S.

The conveyance chamber 1 is provided therein with an imaging unit 9, such as a CCD camera, which is configured to take an image of a substrate S through the openings 83 of the corresponding mask 8. The alignment position refers to a position where both substrate and mask rotation tables 6 and 7 stop according to the imaging unit 9. When the rotation tables 6 and 7 are at the alignment position, the imaging unit 9 takes an image of the substrate S through the openings 83 of the mask 8, and the taken image is subjected to data processing to calculate a correction amount for the position of the mask 8 relative to the substrate S. The mask 8 is aligned with the substrate S by rotating the mask rotation table 7 in the circumferential direction, for example. The method of aligning the mask 8 is not limited to the above description and can be a publicly known substrate alignment method.

The load lock chamber 2 is connected to an exhaust pipe communicating with a not-shown vacuum pump and can be evacuated and held at a predetermined vacuum pressure. Within the load lock chamber 2, stages 21 on which substrates can be temporarily placed are provided. Each substrate S is conveyed to the load lock chamber 2 in atmospheric pressure, and the load lock chamber 2 is evacuated. The substrate S is then conveyed between the stages 21 and the rotation table 6 by a conveyance robot R1 provided between the load lock chamber 2 and the rotation table 6. In this case, the conveyance robot R1 is a multi-joint type provided with a Bernoulli chuck C, which is capable of holding the substrate S with no contact, at its proximal end.

The annealing chamber 3, similar to the load lock chamber 2, is connected to an exhaust pipe communicating with a not-shown vacuum pump and can be evacuated and held at a predetermined vacuum pressure. Moreover, within the annealing chamber 3, a stage 31 on which a substrate S is placed and a heater configured to heat the substrate S, such as a lamp, are provided. The substrate S is conveyed by a conveyance robot R2 provided between the rotation table 6 and the annealing chamber 3. The substrate S is then subjected to annealing (i.e., recrystallization) to repair defects caused in the substrate S by irradiation of phosphor ions. The conveyance robot R2 is, similar to the aforementioned conveyance robot R1, a multi-joint robot provided with a Bernoulli chuck C which is capable of holding the substrate S with no contact at the proximal end.

Figure 3:
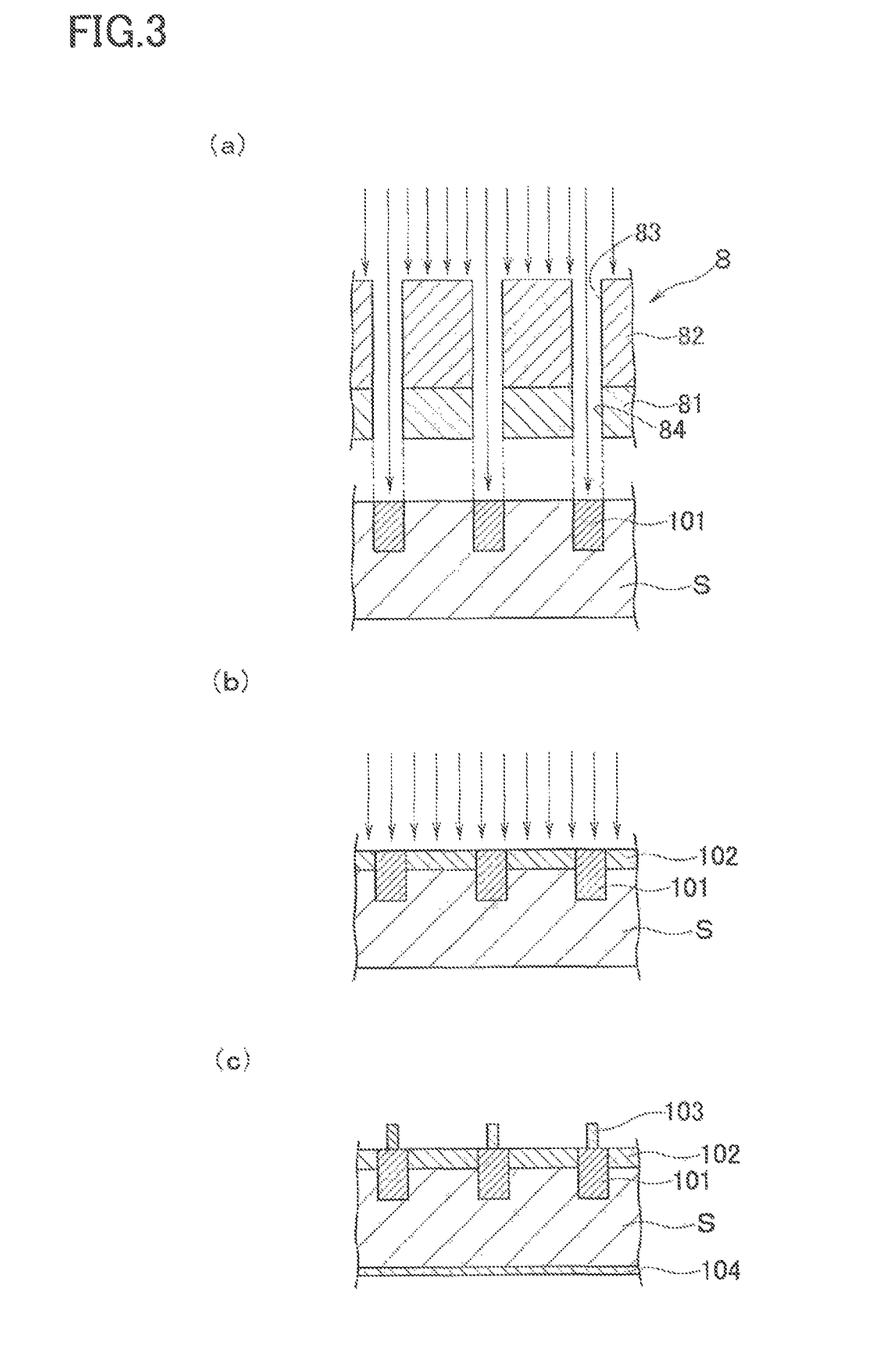
FIGS. 3(a) to 3(c) are views illustrating a process to manufacture a solar cell having a selective emitter structure by a solar cell manufacturing method of the present invention.

Hereinafter, with reference to FIG. 3, the solar cell manufacturing method of this embodiment is described for the case of manufacturing a solar cell of the selective emitter structure using the solar cell manufacturing apparatus M of the aforementioned embodiment by way of example.

First, the two masks 8 are set in the openings 71 of the mask rotation table 7 which are opposite to each other, and then the gate values V are closed for evacuating the conveyance chamber 1. At the same time, the annealing chamber 3 is also evacuated. In this case, the masks 8 are not located at the alignment position. Next, three substrates S as p-type monocrystalline silicon substrates are put into the load lock chamber 2 in atmospheric pressure, and then the load lock chamber 2 is evacuated.

If each of the chambers 1, 2, and 3 reaches a predetermined vacuum, the first substrate S (hereinafter, referred to as a substrate S1) is taken out by the conveyance robot R1 and then delivered onto the rotation table 6 (at the load/unload position). The rotation table 6 is then driven to rotate to move the substrate S1 to the alignment position. Subsequently, the imaging unit 9 takes an image of the substrate S1, and the taken image is subjected to data processing to calculate the correction amount for the position of the corresponding mask 8 relative to the substrate S1. The mask rotation table 7 is then rotated in the circumferential direction for alignment of the mask 8. During this alignment operation, the second substrate S (hereinafter, referred to as a substrate S2) is conveyed to the load/unload position by the conveyance robot R1.

When the alignment of the mask 8 with the substrate S1 is finished, the rotation tables 6 and 7 are driven to rotate in synchronization by one and the same rotation angle to move the substrate S1 and mask 8 to the ion irradiation position. The substrate S1 is then doped with phosphor ions (irradiated with ions) through the mask 8. Herein, in the case of using $PH_3$ (phosphine) containing phosphor as the gas introduced into the plasma generation chamber 50, the conditions of ion irradiation are as follows. The gas flow rate is set to 0.1 to 20 sccm; the AC power applied to the antenna 54 is set to a high frequency power of 20 to 1000 W with a frequency of 13.56 MHz; the voltage applied to the grid plate 52 is set to 30 kV; and the irradiation time is set to 0.1 to 3.0 sec. As shown in FIG. 3(*a*), phosphor ions are doped into an electrode forming region of the substrate S1 through the openings 83 and through holes 84 of the mask 8 to form n+ layers 101.

If the n+ layers 101 are formed in the substrate S1 as described above, only the mask rotation table 7 is rotated to move the mask away from between the substrate S1 located at the ion irradiation position and the grid plate 52. The entire surface of the substrate S1 is then uniformly irradiated with phosphor ions. In this case, the voltage applied to the grid plate 52 is changed to 5 to 10 kV, and the ion irradiation time is changed to 0.1 to 3.0 sec. As shown in FIG. 3B, an n layer 102 is formed at a shallow position of the substrate S1.

While the n layer 102 is formed in the substrate S1 as described above, alignment of the substrate S2 with the corresponding mask 8 is performed for the substrate S2 moved to the alignment position in the same way as described above. After the n layer 102 is formed in the substrate S1, the rotation tables 6 and 7 are driven to rotate in synchronization to move the substrate S2 and mask 8 to the ion irradiation position. Ion irradiation is then performed in the same way as described above. On the other hand, the substrate S1 which has reached the annealing position is then moved into the annealing chamber 3 by the conveyance robot R2 for annealing. In this case, the annealing is performed with the substrate temperature set to 900° C. and the processing time set to two minutes, for example. Defects caused in the substrate S1 by ion irradiation are thus repaired (i.e., recrystallized). During the above processing, the third substrate S (hereinafter, referred to as a substrate S3) is conveyed to the load/unload position by the conveyance robot R1.

When the ion irradiation and annealing for the first and second substrates S1 and S2 are finished, the substrate rotation table 6 is driven to rotate. When the first substrate S1 reaches the load/unload position, the substrate S1 is returned to the load lock chamber 2 by the conveyance robot R1. After the load lock chamber 2 is returned to the ambient atmosphere, the processed substrate S1 is taken out, and another unprocessed substrate is put in. The aforementioned procedure is then repeated for processing of the substrates S. Moreover, in the substrate S1 taken out of the load lock chamber 2, a surface electrode 103 made of Ag and a back electrode 104 made of Al are formed using a publicly-known screen print. This provides a solar cell of the selective emitter structure as shown in FIG. 3(*c*).

Figure 4:
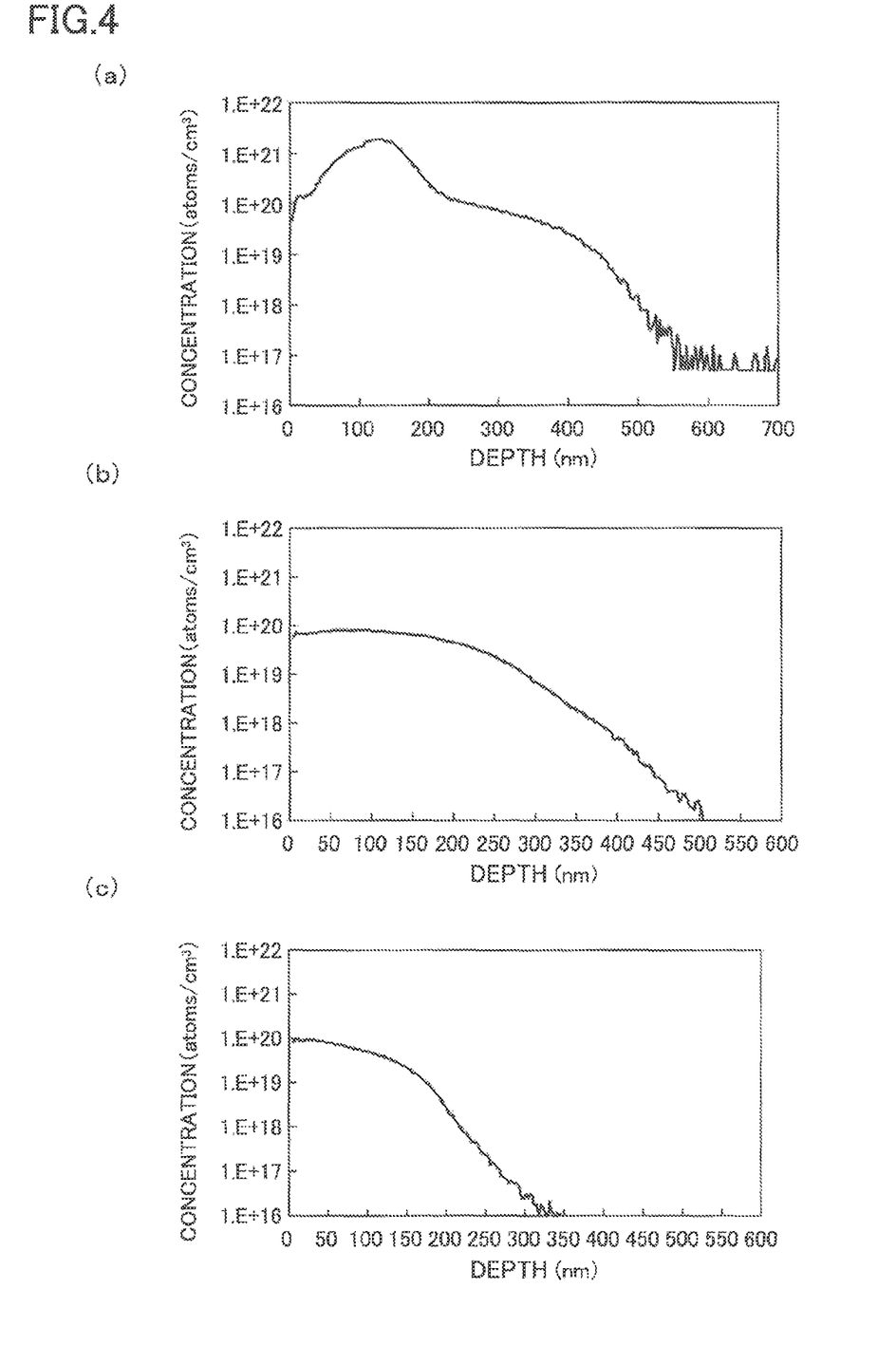
FIGS. 4(a) to 4(c) are diagrams for illustrating the concentration distribution and depth of impurities doped with voltage applied to a grid plate being varied.

Next, in the aforementioned solar cell manufacturing apparatus M, experiments were conducted to confirm how the concentration distribution and depth of impurities change when the voltage applied to the grid plate 52 is varied. The substrates S to be processed were n-type crystalline silicon substrates, and impurity ions doped into the substrate S were boron ions. The voltage applied to the grid plate 52 was set to 30 kV, 20 kV, and 10 kV, and the energy (keV) and dose amount (atoms/cm$^2$) of boron ions were respectively: 30 keV, $2.0 \times 10^{16}$ atoms/cm$^2$ (Invention 1); 20 keV, $1.8 \times 10^{15}$ atoms/cm$^2$ (Invention 2); and 10 keV, $1.2 \times 10^{15}$ atoms/cm$^2$ (Invention 3). FIGS. 4(*a*) to 4(*c*) are SIMS analysis results obtained by irradiating with boron ions under the conditions of Inventions 1 to 3. These reveal that the concentration distribution and depth of boron ions in the substrates can be controlled by changing the voltage applied to the grid plate 52. Moreover, the sheet resistance varied to 26.9Ω (Invention 1), 60.2Ω (Invention 2), and 104.1Ω (Invention 3). This reveals that the sheet resistance can be controlled by the voltage applied to the grid plate 52.

As described above, according to the embodiment, phosphor ions are projected onto the substrate S in a direction substantially orthogonal to the substrate S. Accordingly, phosphor ions can be doped from the substrate surface into any deep position because of the channeling phenomenon. The solar cell manufacturing method of this embodiment requires fewer manufacturing steps than the coating diffusion method of the conventional example and requires shorter annealing time to thermally diffuse phosphor doped into the substrate S, thus increasing the mass-productivity. Furthermore, the mass separator, accelerator, and the like are not necessary to dope phosphor ions, thus leading to lower cost.

At doping of phosphor ions, the depth and concentration of phosphor in the substrate S can be accurately controlled by only controlling the voltage applied to the grid plate 52. Moreover, the region where the through-holes 52*a* of the grid plate 52 are formed is made larger than the area of each substrate to uniformly irradiate the entire surface of the substrate with phosphor ions. Accordingly, the processing time can be shorter than that taken to scan the substrate surface with an ion beam, and the cost can be further reduced. Moreover, phosphor ions can be locally doped into the substrate S by only rotating the mask rotation table 7. This embodiment is advantageous especially in doping phosphor in the selective emitter structure. Furthermore, this embodiment does not need processes to form a mask on the substrate surface and remove the mask, thus further increasing the mass-productivity.

The above description is the embodiment of the present invention, but the present invention is not limited to this embodiment. In the above embodiment, the description is given of manufacturing of a solar cell having a selective emitter structure by way of example. However, the present invention is not limited to this and can be widely applied to doping of impurities in solar cell manufacturing processes, including injection of impurities into an n or p layer forming a rear side contact.

The above embodiment is described by way of example for the case where the load lock chamber 2 and the like are provided around the central conveyance chamber 1 and the rotation table 6 is intermittently driven. The present invention is not limited to such a configuration. The substrates S may be conveyed in a line, and a processing chamber for doping of impurities and an annealing chamber may be provided along the conveyance path. Moreover, the example where the processing chamber 4 is provided within the conveyance chamber 1 is described. However, the processing chamber 4 can be provided separately from the conveyance chamber 1. Furthermore, the method of generating plasma within the plasma generation chamber 50 is not limited to the ISM process and may be an ICP process of the filament arc process. Furthermore, the description is given of the case where impurities are doped with the rotation tables 6 and 7 stopped at the ion irradiation position by way of example. For further increasing the mass productivity, ion irradiation can be performed while the rotation tables 6 and 7 are rotating at constant speed.

Furthermore, the embodiment is described by way of example for the case where the rotation tables 6 and 7 are used to move the substrate S and masks 8 but not limited to this. For example, a mask plate may be connected to the end of the rotating shaft. This rotating shaft is rotated to advance and retract the mask relative to the substrate.

The embodiment is described for the case where phosphor ions are doped into the crystalline silicon substrate by way of example. However, the present invention can be applied to the case of doping impurity ions into an organic semiconductor substrate or a compound semiconductor substrate such as a GaAs substrate, a Cds substrate, a CdTe substrate, and $CuInSe_2$ substrate.

The above embodiment is described by way of example for the case where the ion irradiation and annealing are performed in the same solar cell manufacturing apparatus. However, the ion irradiation and annealing may be performed by different manufacturing apparatuses. However, by continuously performing the both processes in the same manufacturing apparatus, the high mass-productivity is achieved. Moreover, in the above-described example, at manufacturing the selective emitter structure, annealing is performed after ion irradiation is performed twice. However, annealing may be preformed after each time of ion irradiation.

EXPLANATION OF REFERENCE NUMERALS

1 . . . conveyance chamber, 2 . . . load lock chamber, 4 . . . processing chamber, 5 . . . ion gun, 6 . . . substrate rotation table, 7 . . . mask table, 8 . . . mask, 50 . . . plasma generating chamber, 52 . . . grid plate.

The invention claimed is:

1. A solar cell manufacturing apparatus, comprising:
a load lock chamber configured to allow loading and unloading a substrate by switching between atmospheric ambient and vacuum ambient;
a processing chamber where the substrate for a solar cell is to be doped with impurity ions for pn junction formation in the vacuum ambient;
a conveyance chamber including a conveyance unit configured to convey the substrate between the load lock chamber and the processing chamber, wherein the doping of impurity ions is performed by irradiation with impurity ions from an ion gun, and the ion gun is provided with its ion irradiation surface facing the substrate conveyed to the processing chamber;
a mask located between the ion irradiation surface and the substrate and locally shield the substrate; and
a carrier unit configured to carry the mask in such a way as to freely advance and retract the mask to and from a shield position between the ion irradiation surface and the substrate,
wherein the conveyance unit is a substrate rotation table which is rotatable in a single plane parallel to the ion irradiation surface and is capable of holding a plurality of substrates at predetermined circumferential intervals, and
the carrier unit is a mask rotation table which is rotatable around the rotation center of the substrate rotation table above the substrate rotation table and is capable of holding a plurality of masks at predetermined circumferential intervals.

2. The solar cell manufacturing apparatus according to claim 1, wherein
assuming that a direction toward the substrate from the ion irradiation surface is a downward direction,
the ion gun includes: a plasma generation chamber capable of generating plasma containing impurity ions; and a grid plate which is provided at an lower end portion of the plasma generation chamber and constitutes the ion irradiation surface,
a plurality of through-holes are formed in the grid plate,
a region where the through-holes are formed is larger than the area of the substrate, and
the ion gun is configured to hold the grid plate at a predetermined voltage to extract the impurity ions in the plasma generated within the plasma generation chamber downward through the through-holes.

3. A solar cell manufacturing method performed by the solar cell manufacturing apparatus according to claim 1, the method comprising:
an ion irradiation step of irradiating a substrate for a solar cell having a texture structure with ions of impurity selected from P, As, Sb, Bi, B, Al, Ga, and In from an ion irradiation surface of an ion gun facing the substrate;
a defect repair step of performing annealing to repair defect caused in the substrate in the ion irradiation step; and
an impurity diffusion step of diffusing the impurity by the annealing.

* * * * *